US006714021B2

(12) United States Patent
Williams

(10) Patent No.: US 6,714,021 B2
(45) Date of Patent: Mar. 30, 2004

(54) INTEGRATED TIME DOMAIN REFLECTOMETRY (TDR) TESTER

(75) Inventor: Emrys J. Williams, Palo Alto, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 39 days.

(21) Appl. No.: 09/759,126

(22) Filed: Jan. 11, 2001

(65) Prior Publication Data

US 2002/0089335 A1 Jul. 11, 2002

(51) Int. Cl.$^7$ ............................................. G01R 31/11
(52) U.S. Cl. ..................................... 324/533; 324/534
(58) Field of Search ................................ 324/527, 532, 324/533, 534, 637, 642, 644, 750, 769

(56) References Cited

U.S. PATENT DOCUMENTS

| | | | | |
|---|---|---|---|---|
| 5,352,984 A | * | 10/1994 | Piesinger | 324/532 |
| 5,396,170 A | * | 3/1995 | D'Souza et al. | 324/158.1 |
| 6,037,780 A | * | 3/2000 | Ohtaki | 324/535 |
| 6,175,246 B1 | * | 1/2001 | Statovici et al. | 324/765 |
| 6,275,023 B1 | * | 8/2001 | Oosaki et al. | 324/158.1 |
| 6,285,195 B1 | * | 9/2001 | Needle | 324/534 |
| 6,385,561 B1 | * | 5/2002 | Soraghan et al. | 702/185 |
| 6,420,878 B1 | * | 7/2002 | Boorom | 324/533 |
| 6,448,781 B1 | * | 9/2002 | Frank et al. | 324/533 |
| 6,498,473 B1 | * | 12/2002 | Yamabe | 324/158.1 |
| 6,526,465 B1 | * | 2/2003 | Voth et al. | 710/301 |

OTHER PUBLICATIONS

"Time Domain Refectometry Theory", Application Note 1304–2, Hewlett Packard, 1998, 17 pp.
"Evaluating Microstrip with Time Domain Reflectometry", Application Note 1304–1, Hewlett Packard, 1998, 13 pp.

* cited by examiner

Primary Examiner—N. Le
Assistant Examiner—Walter Benson
(74) Attorney, Agent, or Firm—Park, Vaughan & Fleming LLP

(57) ABSTRACT

An integrated TDR for locating transmission line faults. An integrated circuit comprises a transmitter, a path coupled to the transmitter, and a TDR receiver integrated with the transmitter for analyzing a reflected signal from the path. The TDR receiver compares the reflected signal with a variable reference signal to generate a logic state at a sampling instant determined by a timebase generated by a sampling circuit. The reflected signal equals the variable reference signal when the logic state transitions. The reference signal and the corresponding timebase value are recorded at the logic state transition. A waveform is generated from the recorded reference signal and its corresponding timebase value. A reference point for the waveform is determined. The location of a fault on the transmission line can be determined from the timebase value difference between the reference point and the fault.

17 Claims, 14 Drawing Sheets

INTEGRATED TIME DOMAIN REFLECTOMETRY (TDR) TESTER

FIELD OF THE INVENTION

This invention relates to time domain reflectometry (TDR), in particular, to a TDR tester in an integrated circuit (IC) for testing transmission lines.

BACKGROUND OF THE INVENTION

Timely and accurate isolation of transmission line fault locations in a computer system is important, especially in a mission-critical system. Time domain reflectometers have been used in locating transmission line faults. Time Domain reflectometers measure transmission line impedance and determine if there is any discontinuity in the transmission line. TDR testing typically involves a step generator launching a fast edge into the transmission line under investigation through a resistor. The incident and reflected voltage waves are then monitored by a receiver, e.g., an oscilloscope, down stream from the resistor. This echoing technique reveals at a glance the characteristic impedance of the line under investigation in time domain and shows the position and nature (e.g., high or low impedance) of each discontinuity along the line under test. The location of each discontinuity may be calculated from the time delay.

FIG. 1 shows a typical TDR testing setup 100. A step generator 120 produces a positive-going incident wave $E_i$ that is applied to a device 150 under test. The voltage step $E_i$ travels down transmission line 152 at the velocity of propagation of transmission line 152. If load impedance $Z_L$ is equal to the characteristic impedance of transmission line 152, no wave is reflected and all that will be seen at high speed oscilloscope 110 is the incident voltage step $E_r$ recorded by a sample circuit 130 (observed wave shown in FIG. 2A). If a mismatch exists at load $Z_L$, part of incident wave $E_i$ is reflected. The reflected voltage wave $E_r$ will appear on the oscilloscope display algebraically added to the incident wave (observed wave shown in FIG. 2B). The reflected wave is readily identified since it is separated in time from the incident wave. This difference in time is used to determine the length of transmission line 152 from the monitoring point to the mismatch.

The waveform of the reflected wave reveals both the nature and magnitude of the mismatch. For example, for a transmitted voltage step shown in FIG. 2A, the reflected waveform for an open circuit is shown in FIG. 3A. FIG. 3B shows a reflected waveform for a short circuit. FIG. 3C shows a waveform for a load impedance that is twice the line impedance. FIG. 3D shows a waveform for a load impedance that is half the line impedance. FIGS. 4A, 4B, 4C and 4D show sample reflections produced by complex load impedances. For example, FIG. 4A shows a reflected waveform for a series R-L load; FIG. 4B shows a reflected waveform for a shunt R-C load; FIG. 4C shows a reflected waveform for a shunt R-L load; and FIG. 4D shows a reflected waveform for a series R-C load.

Conventionally, a computer system may include multiple printed circuit boards (PCBs). These PCBs are designed to be field-replaceable units (FRUs), such as backplanes 501, 502, 503 and 504 and centerplane 505, shown in FIG. 5. Each backplane 501, 502, 503 and 504 includes, for example, a built-in switch chip 501a that controls switching of various plug-in modules 501c, 501d and 501e in backplane 501 and a built-in control chip 501b for controlling communication with components on other backplanes, e.g., backplane 504. Backplanes 501, 502, 503 and 504 are connected to centerplane 505 which is a passive component, meaning that centerplane 505 simply contains couplers (e.g., compression mount connectors 505a, 505b, 505c and 505d) and no active components. Communication between the various backplanes 501, 502, 503, and 504 is accomplished through the centerplane 505. For example, communication between components 501b on backplane 501 and component 504a on backplane 504 is through a path 506 which includes a trace 506a between component 501b and connector 505a, trace 506b between connectors 505a and 505d, trace 506c between connector 505d and component 504a, and connectors 505a and 505d. Typically, each connector 505a, 505b, 505c and 505d includes multiple pins.

When there is a communication error between components 501b and 504a, the location of faults along path 506 are determined by trial-and-error, for example, by replacing one FRU at a time. Since centerplane 505 is passive, its failure rate is minimal. Hence, backplane 501 or backplane 504 is typically replaced first. Replacing a backplane is a laborious and time-consuming process, and causes great inconvenience to the users. Replacing a backplane can also be very expensive, especially for users who require uninterrupted service of the system.

A lab TDR machine may be used to locate faults along path 506. However, checking each and every connection manually during production is labor intensive and time consuming. In addition, it is often impractical for a service person to carry a lab TDR machine for troubleshooting a system that is up and running because lab TDR machines are expensive and relatively large in size. Furthermore, it is extremely difficult to access the components on a backplane because the backplane is typically buried inside a system. In addition, the pins/connectors on the boards are small and difficult to probe with probes which are of relatively large size. Therefore, locating faults along a path in an integrated circuit board using a lab TDR machine is impractical if not impossible.

SUMMARY OF THE INVENTION

The invention relates to method and apparatus for locating faults in transmission lines conveniently and accurately.

In accordance with the present invention, time domain reflectometer (TDR) testers are integrated into an integrated circuit (IC) to locate transmission line faults. In particular, a TDR tester is integrated into an integrated circuit for each transmitter that needs to be tested. Integration of multiple TDR testers into an integrated circuit allows convenient and accurate diagnosis of transmission line faults, thereby improving reliability prior to shipping of the system and improving first-time fix rate when a fault occurs during operation.

In one embodiment, an integrated circuit comprises a transmitter, a receiver, a path coupled between the transmitter and the receiver, and a TDR receiver for measuring a reflected signal from the path. The TDR receiver receives a variable reference signal.

In one embodiment, the TDR receiver may be a comparator which compares the reflected signal with the variable reference signal to generate an output signal. In one embodiment, an output terminal of the TDR receiver is coupled to a testing circuit which includes a sampling circuit for sampling the output signal at sampling instants determined by a timebase generator. In one embodiment, the timebase generator includes a signal generator, a coarse timebase circuit coupled to the signal generator and a fine timebase circuit coupled to the coarse timebase circuit. The coarse timebase circuit may include a plurality of delay units coupled to a first selector, the delay units being controlled by a clock. The fine timebase circuit may include a plurality of delay units coupled to a second selector.

In one embodiment, for each timebase value, the variable reference signal is varied over a predetermined range. When the output signal of the TDR receiver transitions from logic low to logic high, the reflected signal is approximately equal to the reference signal. A waveform is generated from the reflected signal as a function of time (against the timebase value). The waveform may then be analyzed against predetermined limits to determine whether there is a fault on the transmission line under test and the location of the fault.

In one embodiment, where the integrated circuit includes multiple transmission lines, each transmitter is integrated with a TDR receiver. A selector selects the transmission line under test.

This summary is not intended to limit the scope of the invention, which is defined solely by the claims attached hereto.

While specific embodiments are described and illustrated herein, these embodiments are not intended to limit the scope of the invention, which is susceptible to various modifications and alternative forms.

DETAILED DESCRIPTION OF THE INVENTION

Methods and apparatus for locating faults in a transmission line are provided. One or more embodiments of the invention may be implemented as computer software in the form of computer readable code executed on a general purpose computer or in the form of bytecode class files executable within a Java™ runtime environment running on such a computer. In general, any suitable computer system and programming/processing environment may be used.

Figure 6:
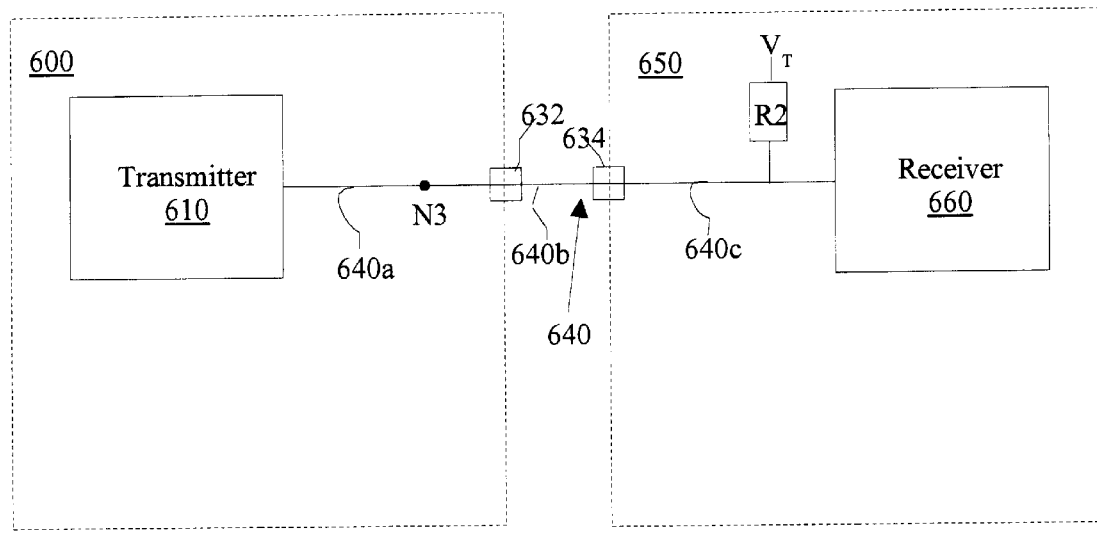
FIG. 6 shows a transmission line between two components on their respective integrated circuits (ICs).

FIG. 6 shows a single ended transmission system for an integrated circuit (IC) 600 and an integrated circuit 650. Integrated circuits 600 and 650 may be, for example, application specific integrated circuits (ASIC). Transmission line 640 provides a communication path between IC 600 and IC 650 and may include traces 640a, 640b and 640c coupled by connectors 632 and 634, respectively. Traces 640a, 640b and 640c may be any known or conventional traces. Connectors 632 and 634 may be, but are not limited to, solder joints, interconnects, compression mount connectors, or splice.

Transmitter 610 on IC 600 may act as a step generator, generating a step voltage to drive transmission line 640 while receiver 660 on IC 650 receives the transmitted step voltage from transmitter 610 through transmission line 640.

Figure 7:
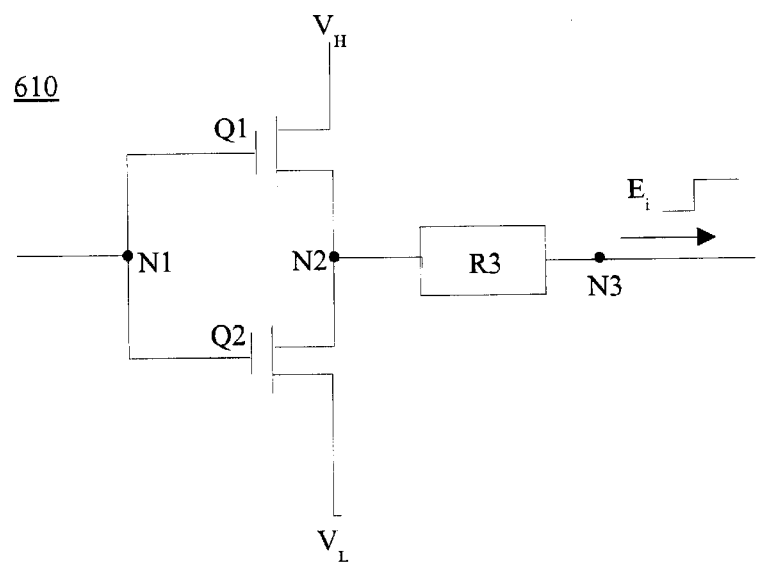
FIG. 7 shows a transmitter in detail.

FIG. 7 shows an example circuit for transmitter 610 shown in FIG. 6. Transistor Q1 and transistor Q2 are coupled in series between a high voltage source $V_H$ and a low voltage source $V_L$, at node N2. The gates of transistors Q1 and Q2 are coupled at node N1. A load resistor R3 is coupled between node N2 and node N3. The value of load resistor R3 typically matches the transmission line impedance of transmission line 640. For example, for a 50-ohm transmission line, the load resistor R3 is also 50 ohms. In general, transmitter 610 may be any suitable step generator.

Referring back to FIG. 6, transmission line 640 is terminated with a terminator resistor R2 which has a terminal coupled to a terminating voltage $V_T$ at the receiver end. In one embodiment, the terminating voltage $V_T$ is approximately midway between voltage $V_H$ and $V_L$. In general, terminating voltage $V_T$ is designed to optimize communication between transmitter 610 and receiver 660 and may be determined using any conventional computer transmission line design method. Receiver 660 may be a single-ended receiver of level-slicer design but may be a receiver of any suitable design.

Figure 1:
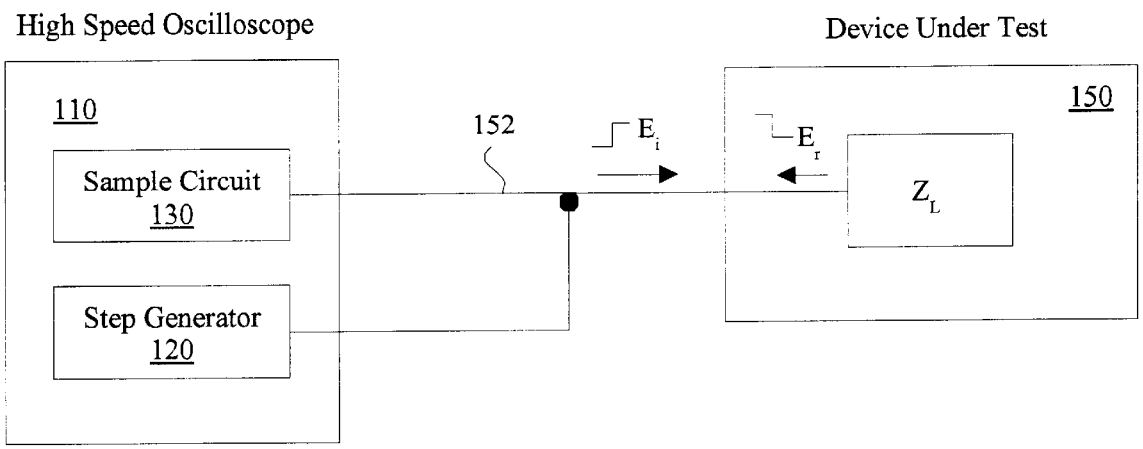
FIG. 1 shows a functional block diagram of a typical TDR testing setup.
Figure 2A:
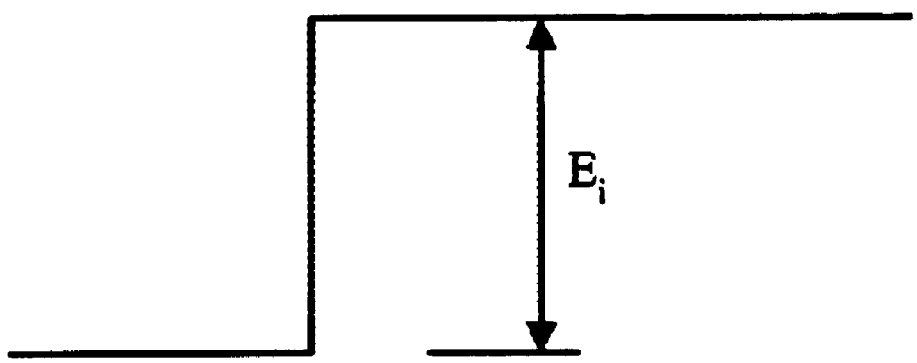
FIG. 2A shows a received waveform when reflected signal is null.
Figure 2B:
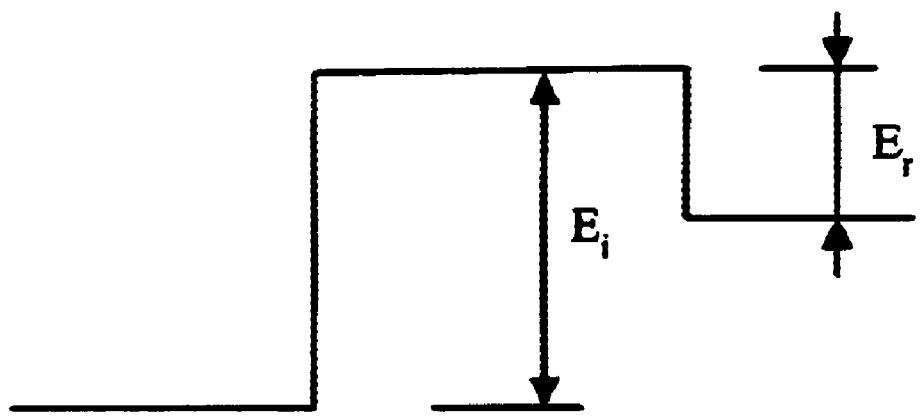
FIG. 2B shows a received waveform when reflected signal is not null.
Figure 3A:
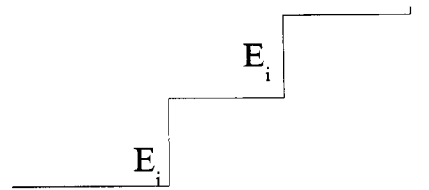
FIG. 3A shows a received waveform for an open circuit.
Figure 3B:
FIG. 3B shows a received waveform for a short circuit.
Figure 3C:
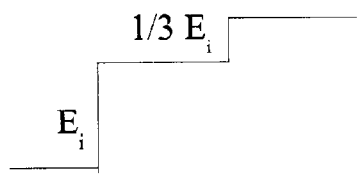
FIG. 3C shows a received waveform when the load is twice the transmission line impedance.
Figure 3D:
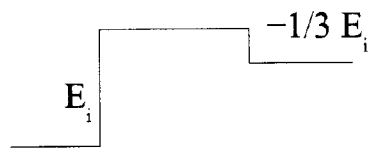
FIG. 3D shows a received waveform when the load is half the transmission line impedance.
Figure 4A:
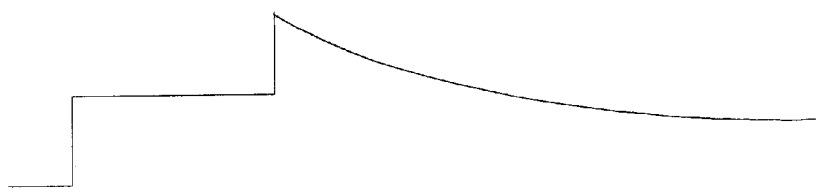
FIG. 4A shows a received waveform produced by a series R-L complex load impedance.
Figure 4B:
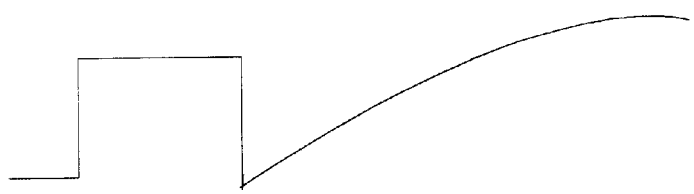
FIG. 4B shows a received waveform produced by a shunt R-C complex load impedance.
Figure 4C:
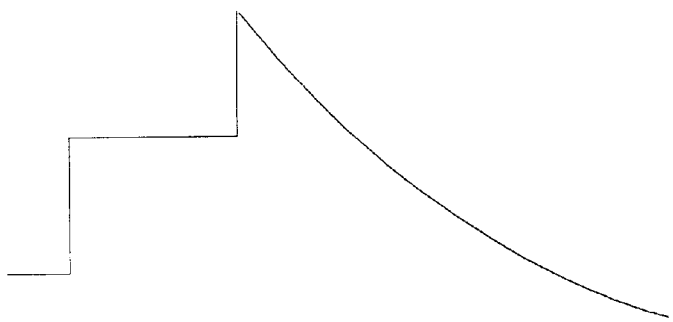
FIG. 4C shows a received waveform produced by a shunt R-L complex load impedance.
Figure 4D:
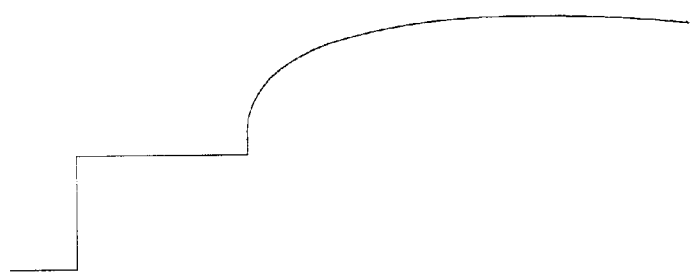
FIG. 4D shows a received waveform produced by a series R-C complex load impedance.

The waveform observed at node N3 depends on the load. For example, if the value of terminating resistor R2 equals to the value of load resistor R3, there is no reflected voltage and the waveform observed at node N3 is as that shown in FIG. 2A. On the other hand, if the value of resistor R2 is equal to zero (i.e., signifying a short), the waveform observed at node N3 is as that shown in FIG. 3B. If the value of resistor R2 is equal to infinity (i.e., signifying an open), the waveform observed at node N3 is as that shown in FIG. 3A.

Figure 8:
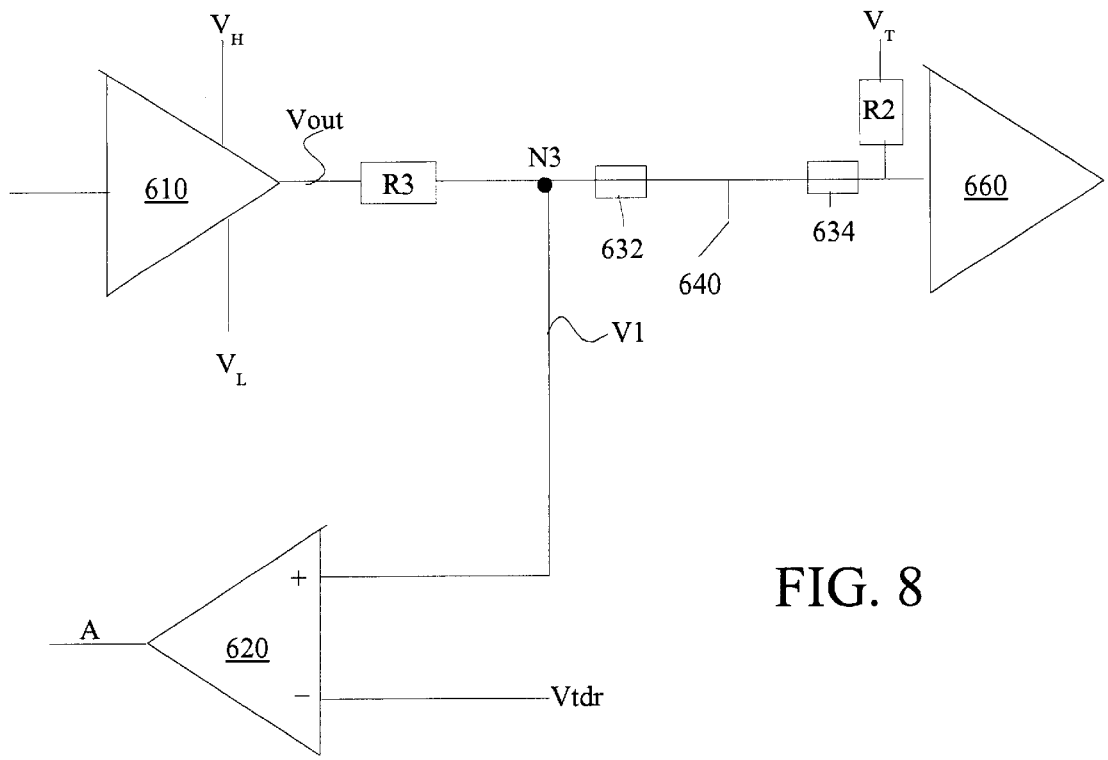
FIG. 8 shows a TDR testing circuit in accordance with the present invention.

FIG. 8 shows a TDR testing circuit in accordance with one embodiment of the present invention. For illustration purpose, values are assigned to various components in the circuit. However, a person of ordinary skill in the art will readily appreciate that these values may vary depending on the design and technology used.

A 50-ohm transmission line 640 is matched with a 50-ohm load (e.g., load resistor R3) and a 50-ohm terminator (e.g., resistor R2) which terminates at a terminating voltage $V_T$ of 0.5V. Transmitter 610, which acts as a step voltage generator, generates a step voltage $V_{out}$ with a high value ($V_H$) of 1 volt and a low value ($V_L$) of 0 volt. Under normal operating conditions, a transmission line without faults should see a common mode range of 0.25V to 0.75V.

A TDR receiver 620 is coupled to node N3 to observe a waveform for received voltage V1. It is noted that in this embodiment, the TDR function is performed only on the transmitter port (e.g., a TDR receiver 620 adjacent to transmitter 610 in the transmitter port) and no circuit modifications are made at the receiver (e.g., receiver 660 on IC 650) end. Implementing TDR receiver 620 at the transmitter port maximizes the effectiveness of the TDR tester. More specifically, if there is a fault in transmission line 640, for example, an open fault between connector 632 and connector 634, the transmitted voltage $V_{out}$ will not propagate beyond the open fault but will be reflected back on transmission line 640. If TDR receiver 620 is located beyond the fault, the TDR receiver will not be able to observe any voltage. In addition, it is generally undesirable to locate TDR receiver 620 at the centerplane because the centerplane is typically kept as simple as possible. It is therefore preferable to locate TDR receiver 620 in the IC at the transmitter end and in close proximity to transmitter 610 to maximize the effectiveness of TDR receiver 620 (or the length of the transmission line it sees).

TDR receiver 620 may be a comparator and may be of a similar circuit design as a level-slicer for a single-ended receiver port. In this description, the term "TDR receiver" is used interchangeably with the term "comparator." In general, comparator 620 should have a greater common mode voltage capability than the transmission line voltage to be seen in a correctly operating transmission line 640. For example, for a transmission line common mode voltage range of 0.25V to 0.75V, the common mode voltage range for comparator 620 may be 0V to 1V. Since such wide range may be difficult to achieve, received voltage V1 may be attenuated prior to entering comparator 620.

Figure 9:
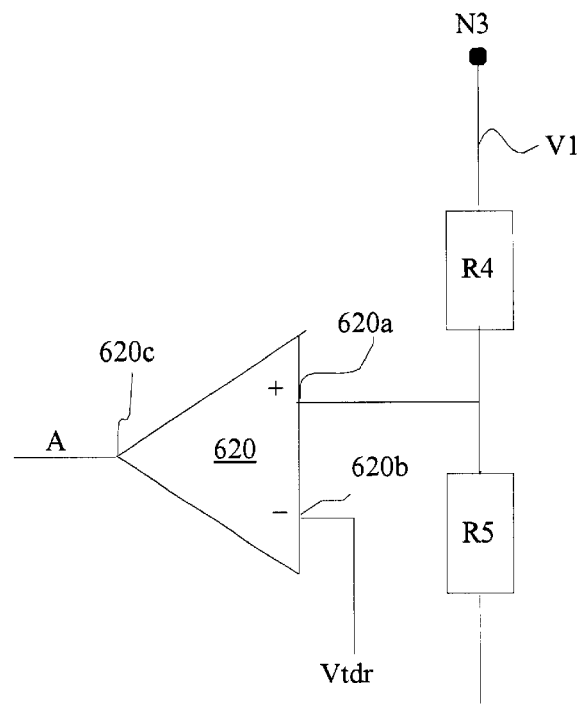
FIG. 9 shows a circuit for attenuating the received signal to improve common mode range for the TDR receiver.

FIG. 9 shows a sample circuit for attenuating received voltage V1 to improve common mode range of comparator 620. A resistor R4 is coupled between node N3 and input terminal 620a and a resistor R5 is coupled between terminal 620a and a DC voltage source, e.g., 0.5V. The DC voltage should be approximately the same as terminating voltage $V_T$ (FIG. 8). Resistor R4 value is typically ten times the value of resistor R5. For example, resistor R4 may be a 500-ohm resistor while resistor R5 may be a 50-ohm resistor.

Reference voltage Vtdr is applied to input terminal 620b of comparator 620. Reference voltage Vtdr may be a DC signal that sets the voltage level at which comparator 620 switches. Received voltage V1 is compared with reference voltage Vtdr at comparator 620 which outputs the compared result as an output signal A. Output signal A at output terminal 620c of comparator 620 is a "1" (or logic high) if received voltage V1 is greater than reference voltage Vtdr. Similarly, if received voltage V1 is less than or equal to reference voltage Vtdr, output signal A at output terminal 620c is a "0" (or logic low). Reference voltage Vtdr is variable and may be varied under, e.g., software control, which is discussed below.

A digital to analog converter (DAC) may be used to generate reference voltage Vtdr. An example DAC is a controlled mark-space ratio oscillator feeding an off-chip decoupling capacitor. The DAC may be, but is not limited to, a 7-bit DAC or a 4-bit DAC. A 7-bit DAC allows a resolution of 128 voltage steps within a voltage range while a 4-bit DAC allows a resolution of 16 voltage steps within a voltage range. For example, for a 1-volt driver, a 7-bit DAC allows a resolution of $\frac{1}{128}$V while a 4-bit DAC allows a resolution of $\frac{1}{16}$V. In general, selection of the DAC depends on the resolution desired which is typically dependent on the noise level in the environment. For instance, a purely digital circuit typically produces an electrically noisy environment and if the electrical noise is high enough, extra DAC resolution may not be useful.

The DAC may be a complete off-chip DAC and the reference voltage Vtdr brought in as an input signal to the IC. In the alternative, the entire DAC may be integrated into the IC. In general, any suitable DAC may be used to generate reference voltage Vtdr. However, it may be difficult to integrate analog circuitry into a fully digital IC and vise versa.

Figure 10:
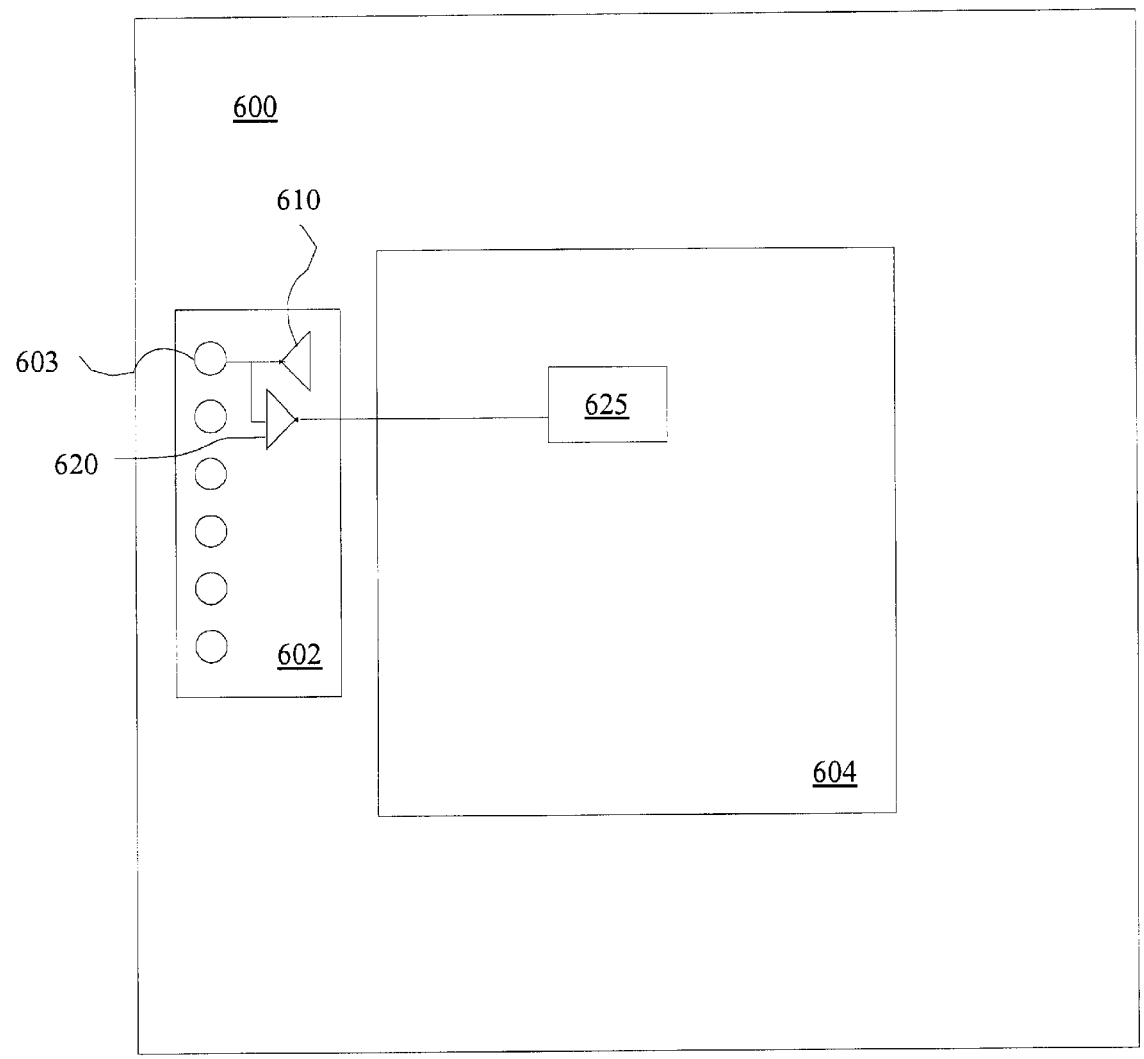
FIG. 10 shows the location of the TDR receiver in an IC.

FIG. 10 shows the location of TDR receiver 620 in IC 600. IC 600 includes a logic core 604 and an IO (input/output) cell (or link) 602. IO cell 602 includes multiple IO pads 603 for communication with other components outside of IC 600. In one embodiment, transmitter 610 and TDR receiver 620 are physically located in IO cell 602 while the remainder of the TDR circuit 625 coupled to TDR receiver 620 is located in logic core 604. In one embodiment, TDR receiver 620 is located in close proximity to IO pad 603 to ensure signal integrity because TDR receiver 620 includes analog circuitry and analog voltage is being routed across IO pad 603.

IO cell 602 may be designed as an integral unit of an IC and may be a custom component of the IC. Logic core 604, on the other hand, typically contains components in a vendor's library, for example, flip-flops and gates. As a custom component, IO cell 602 has particular physical layout requirements in contrast to logic core 604 which does not require any particular physical layout. Thus, it is generally easier and cheaper to build a circuit into logic core 604 rather than integrating the circuit into IO cell 602. In accordance with one embodiment of the present invention, TDR receiver 620 includes analog circuitry while TDR circuit 625 is fully digital, as will be evident later. Thus, there is no analog requirements for TDR circuit 625 and it may be placed in logic core 604.

Figure 11:
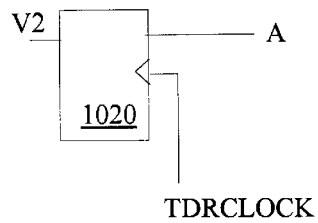
FIG. 11 shows a sampling circuit for controlling the sampling instant of an output signal from the TDR receiver.

In one embodiment, transmission line 640 may be coupled to a sampling circuit 1020, shown in FIG. 11. Output signal A from TDR receiver 620 (FIG. 8) is applied to a sampling circuit (e.g., sample flip-flop 1020 which acts as the sampling gate) which is controlled by a TDR clock timing signal TDRCLOCK. The generation of TDR clock timing signal TDRCLOCK is discussed below.

In one embodiment, on the rising edge of TDR clock timing signal TDRCLOCK, sample flip-flop 1020 samples the current value of output signal A. Output signal A is either logic high ("1") or logic low ("0"), as described above. Sample flip-flop 1020 outputs a signal V2 which is also either logic high or logic low. Signal V2 represents the state of the received signal at a particular time (controlled by the TDR clock timing signal TDRCLOCK).

A typical IC includes multiple transmission lines (driven by their respective transmitters) which are grouped into links and an IC may include multiple links. For example, a link may include 12 data signal wires and two clock signal wires and an IC may include 10 to 20 links. A TDR receiver may be provided for each transmitter.

Figures 12, 13:
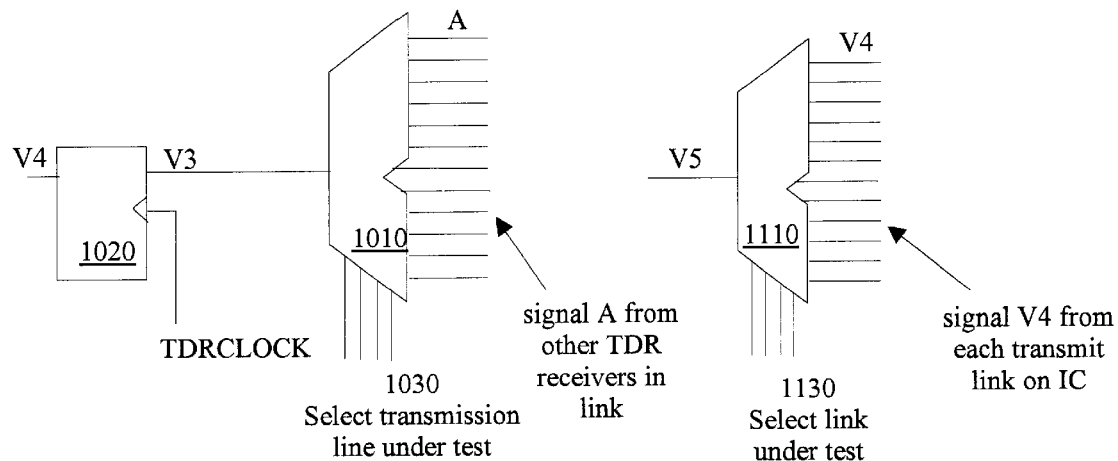
FIG. 12 shows a selector for selecting the transmission line to be tested and a sampling circuit for controlling the sampling instant of an output signal from the selector.
FIG. 13 shows a selector for selecting the link to be tested.

FIG. 12 shows a selector for selecting a transmission line to be tested and a sampling circuit for controlling the sampling instant of an output signal from the selector. The output terminal of the TDR receiver for each transmission line in the link is coupled to a transmission line multiplexer 1010. Transmission line multiplexer 1010 selects the transmission line to be tested. In one embodiment, the selection is performed under software control via select transmission line under test signals 1030. The selected transmission line signal (e.g., output signal A) is outputed from transmission line multiplexer 1010 as an output signal V3. Output signal V3 is then applied to a sampling circuit (e.g., sampling flip-flop 1020) which is controlled by a TDR clock timing signal TDRCLOCK.

In one embodiment, on the rising edge of TDR clock timing signal TDRCLOCK, sampling flip-flop 1020 samples the present value of output signal V3. Output signal V3 is either logic high ("1") or logic low ("0"). Sampling flip-flop 1020 outputs a signal V4 which is also either logic high or logic low. Through transmission line multiplexer 1010, only one signal in an IC is analyzed at a time. Internal delay from TDR receiver to sample gate 1020 does not need to be closely controlled or equal for each TDR receiver. The procedure for calibrating this internal delay is described later in this document.

FIG. 13 shows a link multiplexer 1110 which multiplexes sample flip-flop 1020 output signal V4 from all the links in the IC. In one embodiment, selection of the link under test is performed by software via select link under test signals 1130. Link multiplexer 1110 outputs an output signal V5 which represents the test signal on a selected transmission line in a selected link at a particular instant determined by TDR clock timing signal TDRCLOCK. Since only one multiplexer input is needed for each link, it may be sufficient to use only one link multiplexer per IC. Again, there are no significant delay constraints in this circuit and delays need not be equal from link to link. In general, the sizes of multiplexers 1010 and 1110 depend on the number of transmission lines or links, respectively, in a particular IC.

Figure 14:
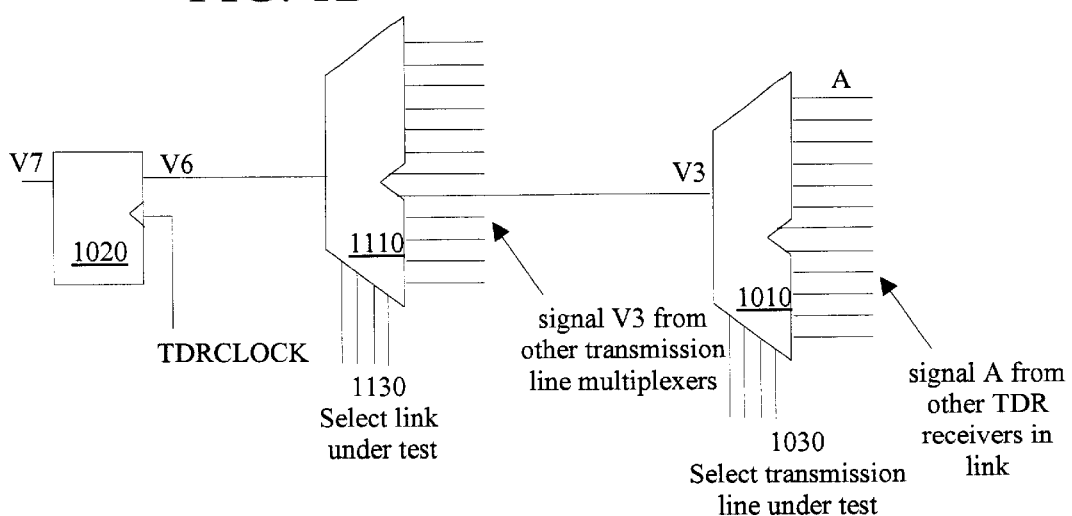
FIG. 14 shows a selector for selecting the link to be tested and a sampling circuit for controlling the sampling instant of an output signal from the selector.

In the alternative, sampling circuit, e.g., sample flip-flop 1020, may be located downstream from link multiplexer 1110, as shown in FIG. 14. Transmission line multiplexer 1010 selects the transmission line under test as described above. Output signal V3 from transmission line multiplexer 1010 is applied to link multiplexer 1110. Output signal V6 of link multiplexer 1110 is then sampled by sample flip-flop 1020 which is controlled by TDR clock timing signal TDRCLOCK. Sample flip-flop 1020 outputs output signal V7 which represents the test signal of the transmission line under test. In general, the sampling circuit may be located anywhere along the TDR test circuit.

Figure 15:
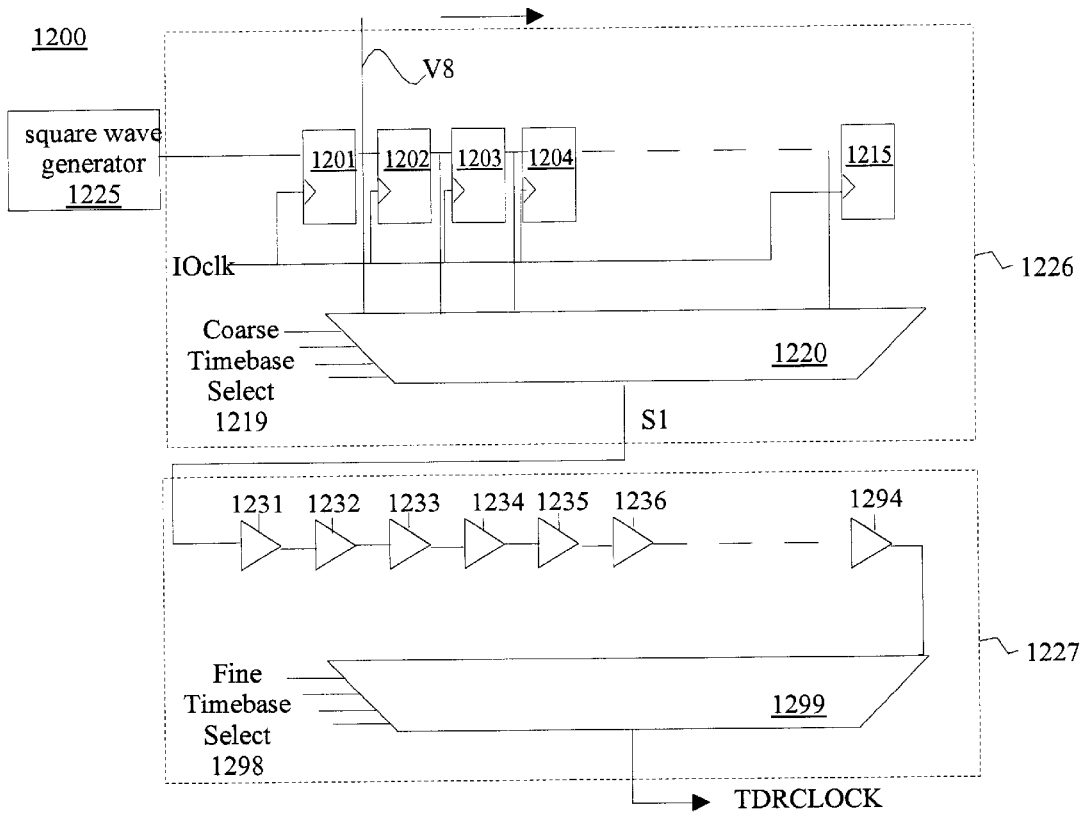
FIG. 15 shows a timebase generator.

FIG. 15 shows a timebase generator 1200 for generating TDR clock timing signal TDRCLOCK. Timebase generator 1200 determines the sampling instant for each reference voltage Vtdr level. TDR clock timing signal TDRCLOCK is different from conventional clock signals such as IO clock and core clock in a synchronous system in that TDR clock timing signal TDRCLOCK does not need precise control in its generation and delivery.

Timebase generator 1200 includes a signal generator 1225. Signal generator 1225 may be a square wave generator, a pulse generator, a waveform generator, and so on. In general, signal generator 1225 generates a signal having a predetermined period that is at least the time needed for a reflected signal on the transmission line under test to subside when the transmitted step transitions. The predetermined period typically depends on the length and the characteristic of the transmission line under test. For example, for a transmission line with a propagation delay of 30 ns, 200 ns should be adequate. Signal generator 1225 may be any suitable signal generator and may be adjusted to meet specific timing requirements.

A coarse timebase circuit 1226 for determining the coarse timebase of the sampling instant is coupled to the signal generator 1225. The output terminal of coarse timebase circuit 1226 is coupled to a fine timebase circuit 1227 which determines the fine timebase of the sampling instant. In one embodiment, coarse timebase circuit 1226 includes a plurality of delay gates, e.g., D-type flip-flops 1201 to 1215, coupled to a coarse timebase multiplexer 1220 which selects the number of delay gates. Delay gates 1201 through 1215 may be any suitable delay elements but each should provide approximately equal delays. The total number of delay gates depends on the total delay required.

Flip-flops 1201 through 1215 are controlled by a clock signal, e.g., IO clock signal IOclk, so that each flip-flop output is one IO clock period apart. The IO clock may be a 500 MHz IO clock which produces clock pulses of 2 ns duration, much shorter than the propagation delay of a typical transmission line. In the alternative, flip-flops 1201 through 1215 may be controlled by a core clock, depending on where timebase generator 1200 is implemented, e.g., implemented in the IO cell or in the logic core. If a core clock is used, the output signal of each flip-flop 1201 through 1215 is one core clock period delayed from the output signal of its previous flip-flop. Output of first delay gate 1201 may be coupled to transmitter 610 to provide step output Vout (FIG. 8).

The output terminal of the coarse time multiplexer 1220 is coupled to a plurality of delay cells, e.g., buffers 1231 to 1294. A fine timebase multiplexer 1299 coupled to the delay cells selects the number of delay cells. In general, the total number of delay cells should provide at least two clock periods of the clock controlling the delay gates (e.g., two IO clock periods or two core clock periods). For example, for the circuit shown, the signal at the last delay cell, e.g., buffer 1294, should be approximately two IO clock periods behind the signal at the first delay cell, e.g., buffer 1231. The output of the fine timebase multiplexer 1299 is the TDR clock timing signal TDRCLOCK. It is noted that time resolution for TDR clock timing signal TDRCLOCK is limited by the resolution of the delay cells in the fine timebase circuit 1227. It is also noted that the delays for each delay cells should be approximately equal.

Flip-flops and delay cells may be conventional, thus readily available. In addition, since there is no timing requirements for the distribution of the TDR clock timing signal TDRCLOCK, timebase generator 1200 may be implemented in the logic core. Of course, other components may be used to build a suitable timebase generator in either the logic core or the IO cell.

Coarse timebase multiplexer 1220 and fine timebase multiplexer 1299 may be controlled by software through coarse timebase select signal 1219 and fine timebase select signal 1298, respectively. The size of coarse timebase multiplexer 1220 and the size of fine timebase multiplexer 1299 depend on the number of delay gates and delay cells, respectively. The selection of a particular multiplexer input at multiplexers 1220 and 1299 is a fixed selection for measurements at a particular reference voltage, which will be discussed below.

Figure 16:
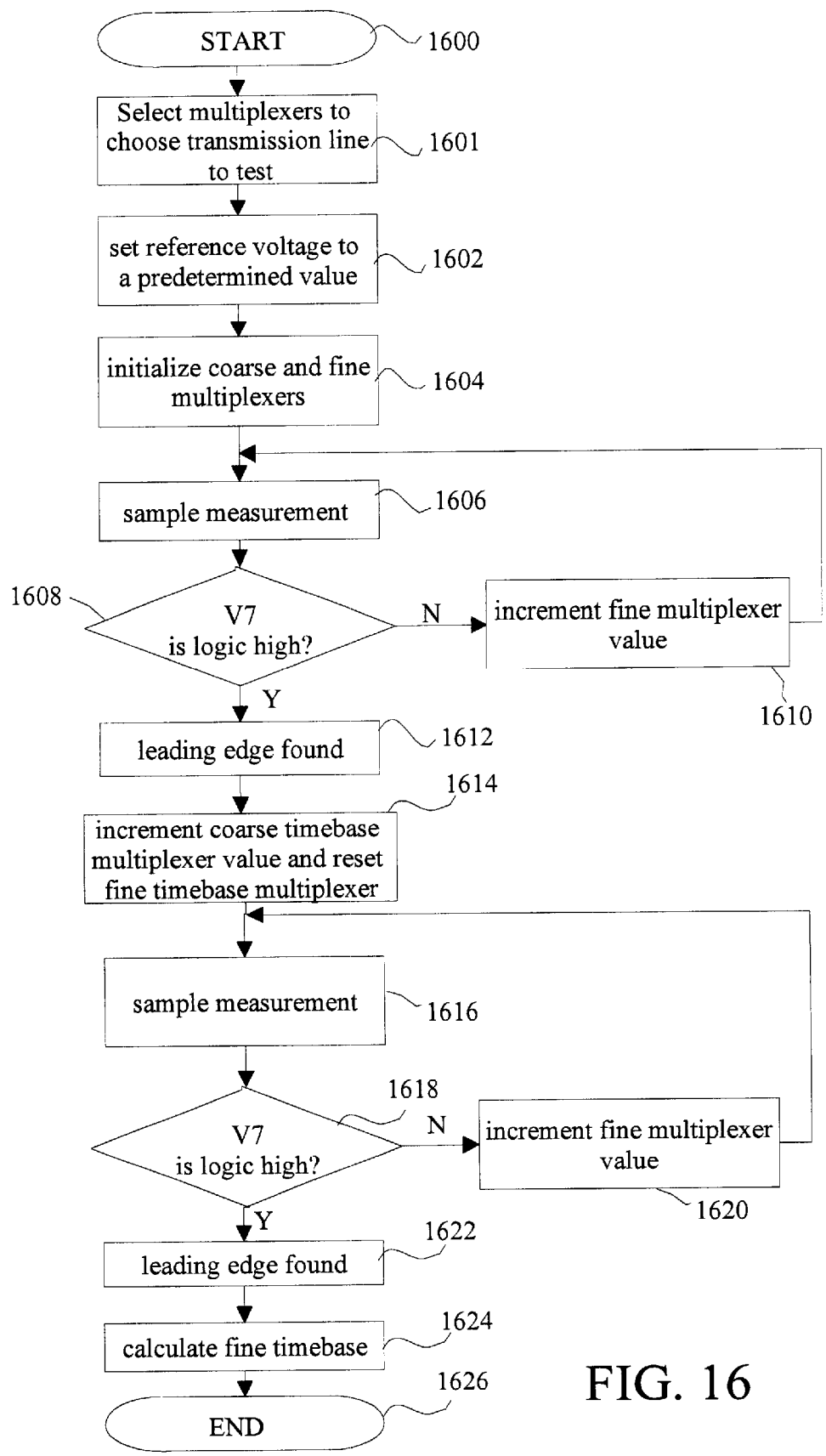
FIG. 16 shows a flow chart for fine timebase calibration.

Because delay cells provide very short time delays, they are sensitive to, and their delays may vary with, process, voltage and operating temperature. Thus, the fine timebase, in one embodiment, is calibrated. FIG. 16 shows a flowchart of the calibration process used for the circuit of FIG. 14 and FIG. 15. The process starts in step 1600. In step 1601, multiplexers are selected to choose the transmission line to test. In step 1602, reference voltage Vtdr is set to a predetermined value, for example, to a voltage level that is approximately midway up the voltage step of received voltage V1 (which is the signal seen at node N3 in FIG. 8) that should be observed for a normal operating transmission line. This is to roughly locate the rising edge of the voltage step generated by the signal generator (or TDR step). Received voltage V1 that should be seen may be used as the initial calibration source and should be usable even if the output is shorted in the system under test further down the transmission line.

In step 1604, the selection value of the coarse timebase multiplexer and the fine timebase multiplexer are initialized, for example, set to 0. In step 1606, output signal V7 is read as a sample measurement. In step 1608, it is determined whether output signal V7 is logic low or logic high. If output signal V7 is logic low, fine timebase is incremented by a delay of one delay cell (e.g., one buffer delay) in step 1610 and the process returns to step 1606 for further measurements. At the next signal period, a measurement is taken for output signal V7 (step 1606). The process is repeated until output signal V7 is logic high, at which point the leading edge of the TDR step (step 1612) is located.

In step 1614, coarse timebase is incremented and fine timebase is reset. Output signal V7 is read at the next TDR step, in step 1616. In step 1618, it is determined whether output signal V7 is logic low or logic high. If output signal V7 is logic low, the fine timebase is incremented in step 1620 and another measurement is read from output signal V7 (step 1616). The process repeats until output signal V7 is logic high, at which point the leading edge is again located (step 1622). The leading edge found in step 1612 and the leading edge found in step 1622 are one IO clock period (or one coarse timebase delay) apart. Thus, the difference between the delay cells used for the first and the second measurement provides a time delay of one clock period and the delay for each delay cell may then be calculated (step 1624). Specifically, $T_F = T_C/(F_1 - F_2)$, where $T_F$ is the fine timebase provided by each delay cell; $T_C$ is the coarse timebase provided by each delay gate; $F_1$ is the number of delay cells used to locate the leading edge with no coarse timebase delay (found in step 1612); and $F_2$ is the number of delay cells used to locate the leading edge with one coarse timebase delay (found in step 1622). The process ends in step 1626.

Figure 17:
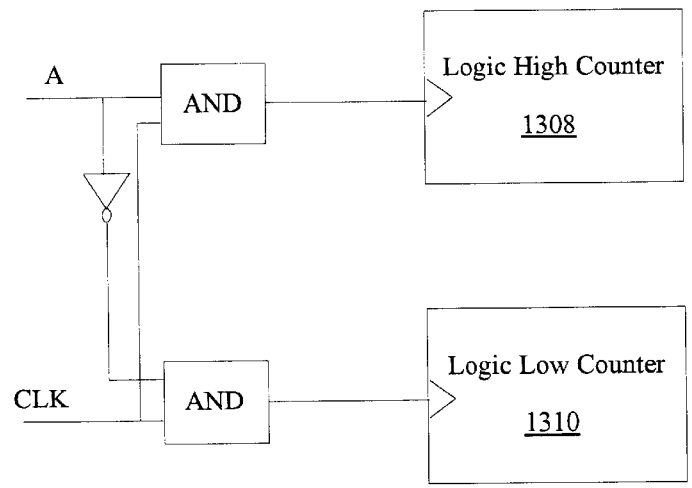
FIG. 17 shows a circuit for accumulating test results.

The above calibration process may be used in a low noise environment, where output signal V7 is read once for every fine timebase increment. Most environments, however, are noisy. In such a system, noise should be taken into consideration. FIG. 17 shows a circuit which accumulates test results from multiple readings. In this embodiment, clock signal CLK transitions just prior to the next edge of TDR step, to collect the measurement of output signal V7. For example, if signal generator 1225 (FIG. 15) generates 200 ns TDR steps, clock signal CLK would transition at 199 ns, a time at which any metastability on the sampled signal V7 would have subsided.

A logic high counter 1308 is incremented if output signal V7 is logic high and a logic low counter 1310 is incremented if output signal V7 is logic low. Logic high and logic low counters 1308 and 1310 may be, for example, 8-bit counters. After a predetermined number of readings, e.g., 256, the accumulated value in logic high counter 1308 and logic low counter 1310 are read. The counter with the higher count indicates the averaged sampled signal. For example, if a predetermined number of 256 readings are taken for a particular timebase, logic high counter 1308 has an accumulated value of 200 and logic low counter 1310 has an accumulated value of 56. Output signal V7 measurement for that particular timebase is then logic high. In the alternative, the measurements for a particular timebase may be terminated when one of the counters reaches a value that is half of the predetermined value. For example, for a predetermined value of 256, when one of the counter has an accumulated value of 128, the measurements for that particular timebase may be terminated and the timebase incremented.

Averaging minimizes the effect of noise. The number of measurements taken for each timebase may be adjusted according to the noise level in the environment. For example, more measurements may be taken for a noisy environment and fewer measurements may be taken for an environment that is not very noisy.

Figure 18:
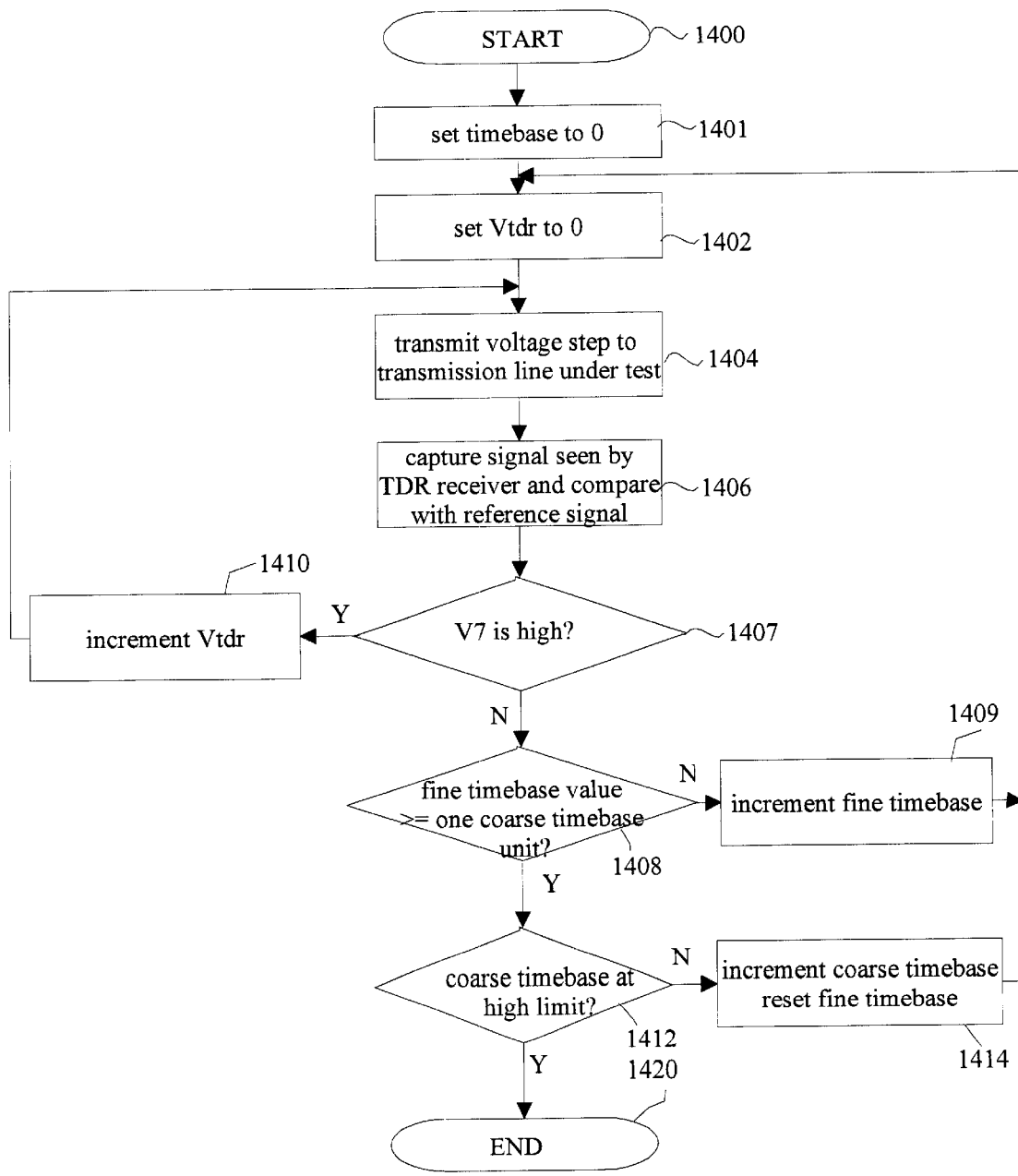
FIG. 18 shows a flow chart for TDR testing process.

FIG. 18 shows a flow chart of a TDR testing process. The process starts in step 1400. In step 1401, timebase is initialized, e.g., both coarse and fine timebase multiplexer values are set to zero. In step 1402, reference voltage Vtdr is initialized, e.g., set to zero.

A voltage step is transmitted to the transmission line under test in step 1404. In step 1406, signal (V1) seen by the TDR receiver is captured and compared with the current value of reference voltage Vtdr in comparator 620 at a particular sample instant set by the timebase generator. In step 1407, it is determined whether the sampled voltage V7 is low or high. If sampled voltage V7 is high, input voltage V1 is higher than reference voltage Vtdr. Reference voltage Vtdr is incremented in step 1410. The loop containing steps 1404, 1406, 1407 and 1410 is executed until sampled voltage V7 is low, at which time voltage V1 is known to be equal to reference voltage Vtdr at the sample time determined by the timebase.

After the input voltage V1 has been determined for one timebase value, it is determined whether the fine timebase is equal to or greater than one coarse timebase unit (step 1408). If the fine timebase value is less than one coarse timebase unit, the fine timebase value is incremented by one fine timebase unit (step 1409). The voltage V1 seen by the TDR receiver is again captured (loop containing steps 1404, 1406, 1407 and 1410).

If the fine timebase value is equal to or greater than one coarse timebase unit (step 1408), it is determined whether the coarse timebase value is at its high limit (step 1412). If the coarse timebase is not at its high limit, the coarse timebase value is incremented by one coarse timebase unit and the fine timebase value is reset to zero in step 1414. The signal seen by TDR receiver is again captured.

If the coarse timebase value is at its high limit (step 1412), the process ends (step 1420). It is noted that the above process may incorporate timebase calibration for the timebase generator and/or multiple measurements averaging for each timebase value.

Figure 19:
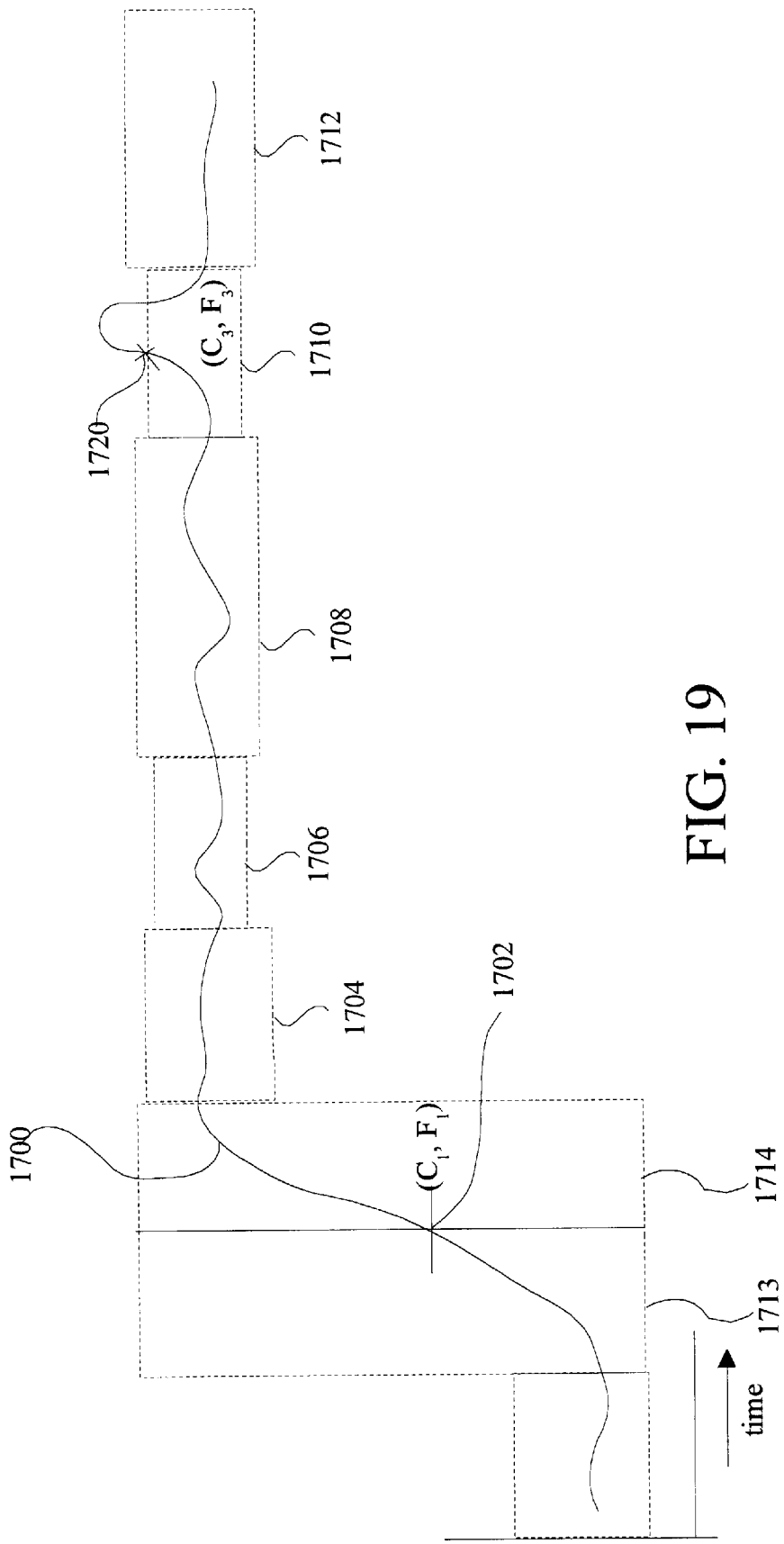
FIG. 19 shows a waveform of the received signal.

The values of V1 determined at each sample instant determined by the timebase can be shown as a waveform. An example of waveform 1700 is shown in FIG. 19. By observing waveform 1700, the fault closest to the transmitter on the transmission line may be observed and the fault location calculated.

To analyze the fault location, a calibration point 1702 is first located. Calibration point 1702 indicates the position of a leading edge of waveform 1700 and has a location of $C_1$ (coarse timebase value) and $F_1$ (fine timebase value).

To locate calibration point 1702, waveform 1700 is searched from lowest timebase value to highest. Point 1702 is the first timebase value for which the measured voltage value V1 exceeds the termination voltage $V_T$.

Waveform 1700 may be analyzed automatically by a testing software, or by human analysis. In the case of human analysis, the voltage waveform may be displayed on a screen. In the case of automated testing software, the software may perform automated testing similar to that available from a lab TDR analyzer.

Specifically, for each section of the transmission line under test, voltage limits above and below the nominal value (e.g., what the voltage should be) are known based on the characteristic of the transmission line, e.g., propagation delay. The voltage limits may be pre-programmed from Simulation Program with Integrated Circuit Emphasis (SPICE, which is a program widely used to simulate the performance of analog electronic systems and mixed mode analog and digital systems) simulation or determined from circuit analysis of a circuit prototype. These predetermined limits may be drawn as dotted boxes 1704, 1706, 1708, 1710, 1712, 1713 and 1714. For calibration, boxes are arranged contiguously with the edge between box 1713 and box 1714 at the calibration point 1702.

Figure 5:
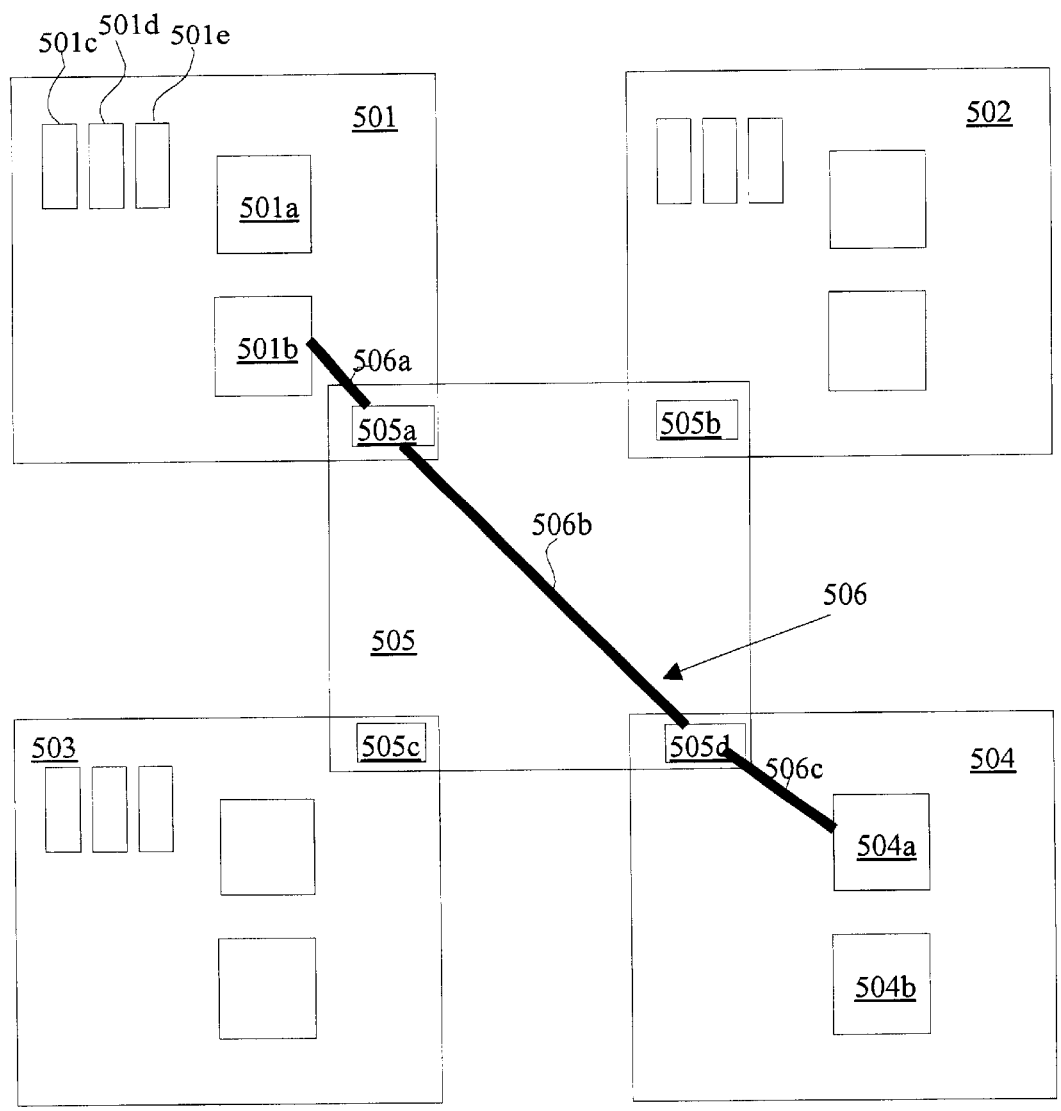
FIG. 5 shows a system having a plurality of backplanes coupled through a centerplane.

It is noted that for a transmission line, there may be multiple sections, e.g., connectors connecting various traces. Therefore, multiple boxes indicate different sections in the transmission line under test, e.g., transmission line 506 in FIG. 5. For example, the waveform in box 1704 indicates the voltage level in transmitter PCB 501; the waveform in box 1706 indicates the voltage level in connector 505a; the waveform in box 1708 indicates the voltage level in centerplane PCB 505; the waveform in box 1710 indicates the voltage level in connector 505d; and the waveform in box 1712 indicates the voltage level in receiver PCB 504.

The software looks along the voltage waveform 1700 to see if the voltage at any point exceeds the limits indicated by the dotted boxes 1704, 1706, 1708, 1710 and 1712. If the voltage waveform generated is within the dotted lines of boxes 1704, 1706, 1708, 1710, and 1712, transmission line 506 is operating in its normal condition. On the other hand, a point having a voltage outside of a dotted box, for example, box 1710, indicates a fault in transmission line 506, e.g., located at connector 505d. Since every point on waveform 1700 has an associated timebase value, the distance from the reference point 1702 to the fault point 1720 may be calculated. For example, fault point 1720 has an associated coarse and fine timebase of $C_3$ and $F_3$, respectively, and reference point 1702 has a timebase of $C_1$ and $F_1$. The propagation time from the reference point 1702 to the fault point 1720 may be calculated as follows, $$T_X = [(C_3 - C_1)T_C + (F_3 - F_1) \times T_F]/2,$$

where $T_X$ is the propagation time from the reference point to the fault; $T_C$ is the delay for each coarse timebase unit (e.g., time delay for one delay gate); and $T_F$ is the delay for each fine timebase unit (e.g., time delay for one delay cell). The equation is divided by two because the time for a transmitted voltage to be received at the TDR receiver is the propagation delay for the transmitted signal to travel from the transmitter to the fault and back to the TDR receiver which is in close proximity to the transmitter. The distance to fault can then be calculated from the time to fault $T_X$ by multiplying the propagation delay characteristic of a given transmission line.

It is noted that in a software implementation, the software may be configured to allow measurement for positive and/or negative edges of the voltage step.

By dividing up the voltage trace along the time axis, the software can first locate a fault by the voltage excursion (e.g., in box 1710), then see what part of the circuit the fault lies in by calculating the distance with respect to time. With an automated testing program, every connector and transmission line may be tested without human intervention. In one embodiment, the software may generate error messages that may be monitored at a local display or at a remote display.

In addition to testing data output pins in an IC, clock pins may also be tested in a similar fashion. Testing clock pins are highly desirable as they form a significant fraction of interconnects on a chip.

The above circuit may be used to accurately locate a fault that is closest to the TDR receiver because signal may not propagate correctly through the fault location. Thus, for multiple faults in a transmission line, one may correct the fault located closest to the TDR receiver and then perform the TDR testing process on the same transmission line again to locate additional faults along the transmission line.

The TDR tester may be used to diagnose a fault on a system that is running because since only one pin is being tested, only one link needs to be brought down for testing while the remainder of the chip/system remains operational. For example, the TDR testing may be done for a switch chip that is still running and handling UNIX traffic. Any fault on an interconnect pin or related transmission line may initiate the TDR testing routine for that specific pin. Although such a system may produce a very noisy environment, additional sampling and averaging may provide an accurate diagnosis of the fault location. All control for the software may be through conventional registers. The TDR testing described above is also useful to test all transmission lines in a system during production to ensure high reliability prior to shipping of the product.

A person of ordinary skill in the art will readily appreciate that the above principles are applicable to single ended transmission lines as well as differential transmission lines. In accordance with the present invention, the TDR circuit operates on each wire of the differential transmission line individually. For example, if there are D+ and D− versions of a signal, two separate TDR receivers are needed, one for signal D+ and one for signal D−. The two separate TDR receivers operate independently. Although full differential-mode TDR is possible, operating on each wire individually allows independent measurements of the positive and the negative voltages. For example, by driving a positive step voltage STEP+ on the D+ wire and driving its inverse step voltage STEP− on the D− wire allows independent operation and measurement of the differential wires. In other words, the signals, controls, and readings of each TDR do not need to be executed simultaneously.

Figure 20:
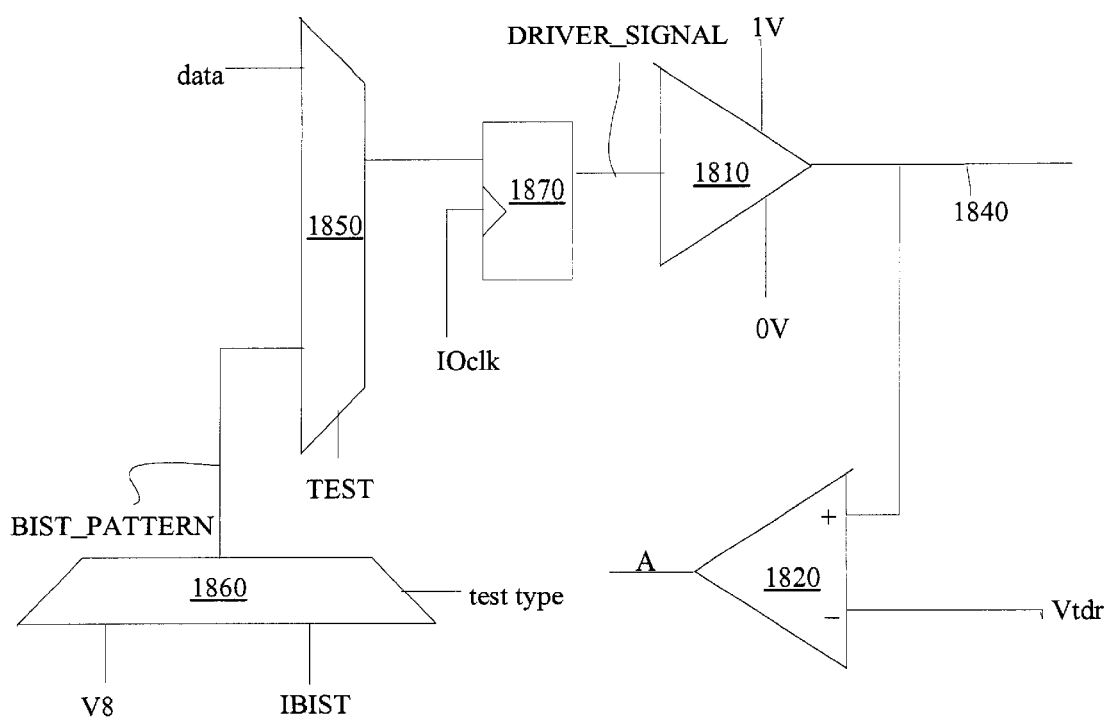
FIG. 20 shows TDR testing integrated with other types of transmission line testing.

In one embodiment, the integrated TDR circuit described above may be integrated with other types of interconnect testing such as an interconnect built-in self-test (IBIST), as illustrated in FIG. 20. IBIST validates that the signal connections between PCBs can operate at full system frequencies. As such, IBIST ensures that hot-plugged boards made secure electrical connections before they were enabled to communicate with the rest of the system. IBIST testing is directed by the system controllers and limited to those links which crossed a board connector. Thus, IBIST checks for a different type of transmission line integrity than TDR testing.

In accordance with one embodiment of the present invention, TDR testing and IBIST may be used to generate a BIST (built-in-self-test) pattern to test a particular transmission line. For example, multiplexer 1860 may select the test type (e.g., TDR test (V8, also see FIG. 15) or IBIST) via a select test type signal that may be generated by software. Multiplexer 1860 outputs a BIST pattern BIST_PATTERN which is inputed into a multiplexer 1850 which selects between, e.g., normal data or a particular BIST pattern via a control signal TEST that may be generated by software. An output transmit flip-flop 1870 controlled by, e.g., IO clock signal IOclk, generates a signal DRIVER_SIGNAL that is transmitted to a transmitter 1810 which transmits the signal via transmission line 1840 to a receiver (not shown). The reflected signal is then observed by a TDR receiver 1820.

While the present invention has been described with reference to particular figures and embodiments, it should be understood that the description is for illustration only and should not be taken as limiting the scope of the invention. Many changes and modifications may be made to the invention, by one having ordinary skill in the art, without departing from the scope of the invention.

I claim:

1. A computer system comprising:
   a centerplane;
   a first backplane coupled to the centerplane; and
   a second backplane coupled to the centerplane;
   wherein the first backplane can communicate with the second backplane through the centerplane;
   wherein the first backplane includes a time domain reflectometer transmitter and a time domain reflectometer receiver that are configured to determine a fault location on the first backplane, the fault location not being on a wire shielded within a protective tube.

2. The computer system of claim 1, wherein the time domain reflectometer receiver is on the same electrical device as the time domain reflectometer transmitter.

3. The computer system of claim 1, wherein the time domain reflectometer receiver compares a variable reference signal to a reflected signal to determine the fault location within the first backplane.

4. The computer system of claim 1, wherein the computer system further includes:
   an attenuating circuit coupled to the time domain reflectometer receiver for attenuating a reflected signal.

5. The computer system of claim 1, wherein the time domain reflectometer transmitter and the time domain reflectometer receiver are located in an IO cell of an integrated circuit.

6. The computer system of claim 1 wherein the first backplane includes a testing circuit coupled to an output terminal of the time domain reflectometer receiver.

7. The computer system of claim 6, wherein the testing circuit is located in a logic core of an integrated circuit.

8. The computer system of claim 6, wherein the testing circuit comprises a sampling circuit.

9. A computer system comprising:
   a centerplane;
   a first backplane coupled to the centerplane; and
   a second backplane coupled to the centerplane;
   wherein the first backplane can communicate with the second backplane through the centerplane;
   wherein the second backplane can communicate with the first backplane through the centerplane;
   wherein the first backplane includes a first time domain reflectometer transmitter and a first time domain reflectometer receiver that are configured to determine a first fault location on the first backplane;
   wherein the second backplane includes a second time domain reflectometer transmitter and a second time domain reflectometer receiver that are configured to determine a second fault location on the second backplane.

10. The computer system of claim 9, wherein the first time domain reflectometer receiver is on the same electrical device as the first time domain reflectometer transmitter.

11. The computer system of claim 9, wherein the first time domain reflectometer receiver compares a variable reference signal to a reflected signal to determine the first fault location within the first backplane.

12. The computer system of claim 9, wherein the computer system further includes:
   an attenuating circuit coupled to the first time domain reflectometer receiver for attenuating a reflected signal.

13. The computer system of claim 9, wherein the first time domain reflectometer transmitter and the first time domain reflectometer receiver are located in an IO cell of an integrated circuit.

14. The computer system of claim 9 wherein the first backplane includes a testing circuit coupled to an output terminal of the time domain reflectometer receiver.

15. The computer system of claim 14, wherein the testing circuit is located in a logic core of an integrated circuit.

16. The computer system of claim 14, wherein the testing circuit comprises a sampling circuit.

17. A computer system comprising:
   a centerplane;
   a first backplane coupled to the centerplane, the first backplane having a first connector; and
   a second backplane coupled to the centerplane, the second backplane having a second connector;
   a first printed circuit board coupled to the first backplane via the first connector;
   a second printed circuit board coupled to the second backplane via the second connector;
   wherein the first backplane can communicate with the second backplane through the centerplane;
   wherein the second backplane can communicate with the first backplane through the centerplane;
   wherein the first printed circuit board can communicate with the second printed circuit board through the first backplane, the centerplane, and the second backplane;
   wherein the second printed circuit board can communicate with the first printed circuit board through the second backplane, the centerplane, and the first backplane;
   wherein the first backplane includes a first time domain reflectometer transmitter and a first time domain reflectometer receiver that are configured to determine a first fault location on the first backplane;
   wherein the second backplane includes a second time domain reflectometer transmitter and a second time domain reflectometer receiver that are configured to determine a second fault location on the second backplane.

* * * * *